United States Patent [19]

Shyu

[11] Patent Number: 4,687,554

[45] Date of Patent: Aug. 18, 1987

[54] ELECTROLYTIC APPARATUS AND PROCESS

[75] Inventor: Jieh-Hwa Shyu, Hackensack, N.J.

[73] Assignee: OMI International Corporation, Warren, Mich.

[21] Appl. No.: 825,112

[22] Filed: Feb. 3, 1986

[51] Int. Cl.⁴ ............................................. C25D 5/00
[52] U.S. Cl. ....................................................... 204/23
[58] Field of Search ............................... 204/23, 5, 27

[56] References Cited

U.S. PATENT DOCUMENTS

| | | | |
|---|---|---|---|
| 4,174,261 | 11/1979 | Pellegrino | 204/275 |
| 4,269,669 | 5/1981 | Soby | 204/5 |
| 4,391,694 | 7/1983 | Runsten | 204/5 |
| 4,507,180 | 3/1985 | van der Werf | 204/5 |

Primary Examiner—T. M. Tufariello
Attorney, Agent, or Firm—Richard P. Mueller

[57] ABSTRACT

An improved electrolytic apparatus and process particularly applicable for high-speed electrodeposition of a metallic plating on a substrate such as on a printed wiring board of the type employed in the electronic industry. The apparatus employs a manifold assembly adapted to be immersed in the electrolyte and positioned adjacent to each of the anodes immersed therein for withdrawing electrolyte past the anode to provide a controlled rate of flow across the anode surface to achieve a substantially uniform mass transport rate across the fluid film on the surface of the anode. The apparatus is also adapted for returning at least a portion of the withdrawn electrolyte to the tank which can be arranged so as to impinge upon the article being plated.

4 Claims, 3 Drawing Figures

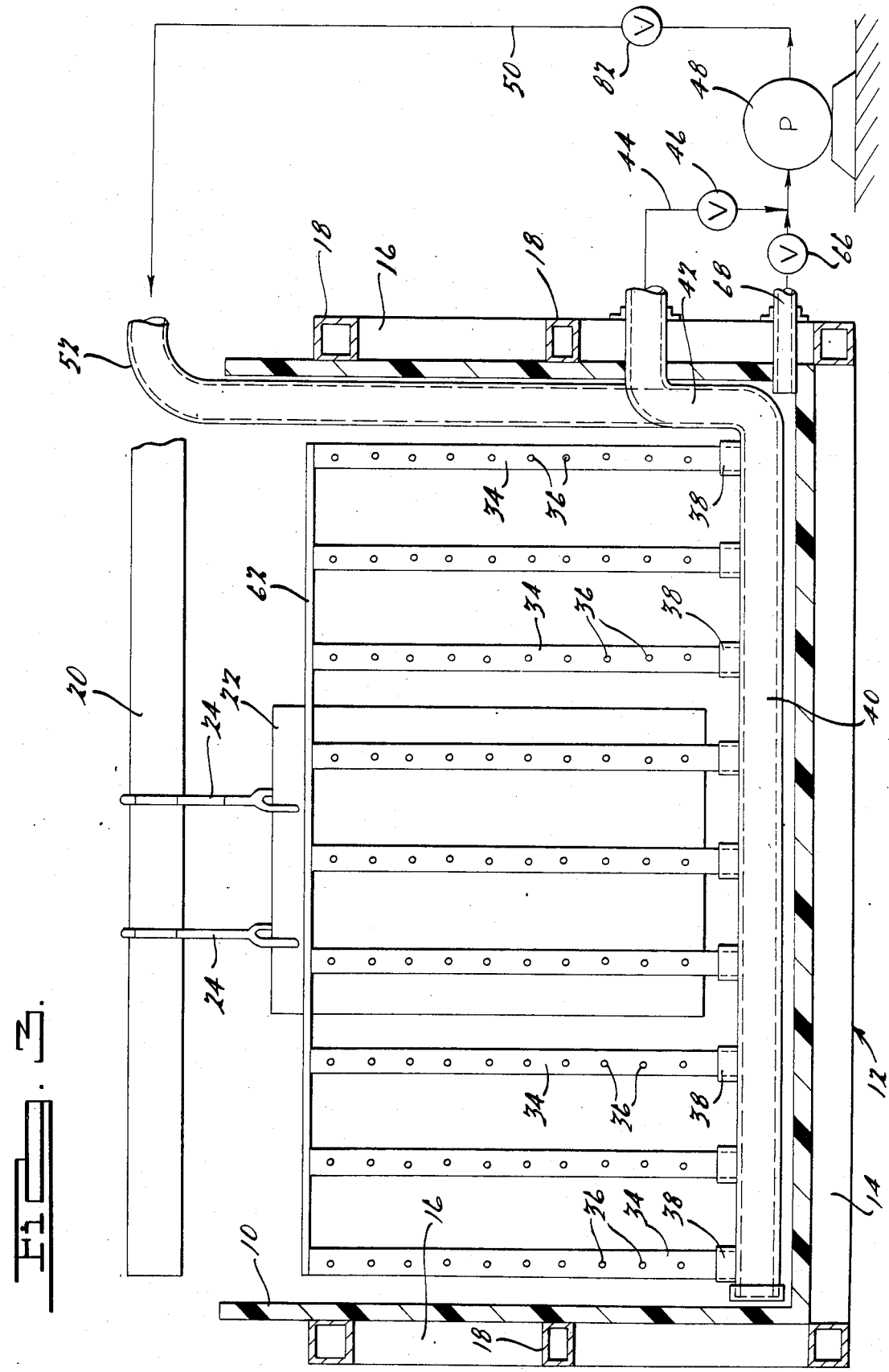

ELECTROLYTIC APPARATUS AND PROCESS

The present invention broadly relates to an improved electrolytic apparatus and process, and more particularly, to an improved high-speed electroplating cell and process for effecting a rapid electrodeposition of a metallic plating on a substrate. More specifically, the present invention is directed to an improved electrolytic cell and process for electrodepositing copper on a substrate, and particularly, on printed wiring boards of the types employed in the electronic industry.

The art of electroplating is well known and in widespread use in industry for electrodepositing a variety of metals and metal alloys on substrates to provide a functional or decorative electrodeposit on the substrate or selected portions thereof. The adoption of printed wiring boards in the electronic industry has prompted a need for electrolytic apparatuses and processes for effecting a more rapid deposition of metal deposits, particularly copper on the wiring board providing for a uniform, adherent electrodeposit which is of the desired thickness and which also covers the interior surfaces of through-holes in the wiring board to which electronic components are subsequently wired. Attempts to increase the plating rate of such electrolytic devices of the types heretofore known has not been successful due to the tendency of forming non-uniform electrodeposits, a so called "burning" of the deposit in localized areas thereof, a passivation of the soluble anodes employed in the electrolyte and/or a nonuniform coverage of the aperture or holes in the wiring board. Attempts to eliminate one or more of these problems by providing air agitation and other mechanical agitation techniques have not been entirely successful.

One such prior art electrolytic apparatus is described in U.S. Pat. No. 4,174,261 granted on Nov. 13, 1979 and entitled "Apparatus for Electroplating, Deplating or Etching". According to the apparatus described in the aforementioned U.S. patent, a plurality of spray nozzles or jets are provided which are adapted to discharge the electrolyte directly against the surface of the substrate, such as a printed wiring board, to be plated while a suction port is provided adjacent to the spray nozzle for immediately withdrawing the electrolyte from the vicinity of the article being plated. While an improvement in the rate of deposition of the plating metal is achieved, nevertheless, the rate of electrodeposition is less than optimum.

In accordance with the electrolytic device and process of the present invention, a substantial improvement is achieved in the rate of electrodeposition of a metal such as copper on an article such as a printed wiring board whereby a substantial improvement in production capacity can be achieved, while at the same time providing for uniform, adherent electrodeposits over all or the selected areas to be plated. The apparatus is further characterized as being adaptable for installation in conventional prior art-type electrolytic apparatuses enabling their operation in accordance with the present invention and achieving the improved benefits and economies resulting therefrom. The electrolytic apparatus and process of the present invention is further characterized by its simplicity in construction, ease of operation and control, and efficiency and durability in operation.

SUMMARY OF THE INVENTION

The benefits and advantages of the present invention are achieved by an electrolytic apparatus including a tank or receptacle adapted to contain a body of electrolyte therein. Supporting means are provided for supporting a workpiece to be electroplated in immersed relationship in the electrolyte. The supporting means may conventionally comprise an electrified cathode bar for cathodically electrifying the workpiece during an electroplating operation. The apparatus further comprises an anode support for supporting at least one, preferably a plurality of soluble anodes in immersed relationship in the electrolyte in spaced relationship from the workpiece. The anode support preferably comprises an electrified anode bar for anodically electrifying the anodes during an electroplating operation in a manner to cause electric current to flow between the workpiece and the anode. A manifold assembly is further provided which is immersed in the electrolyte and positioned adjacent to at least one side of each of the anodes therein including a plurality of inlet ports for withdrawing electrolyte at a controlled flow rate across the surfaces of the anodes to achieve a substantially uniform mass transport rate across the anode fluid film to avoid anode passivation and to simultaneously preserve the anode film. This can be achieved by controlling the velocity of the electrolyte at the surface of the anode within a range of about 0.3 to about 6 feet per second, preferably, from about 1 to about 3 feet per second.

In accordance with a preferred embodiment of the present invention, the electrolyte withdrawn through the manifold assemblies is returned to the electroplating tank and can be discharged in the form of jets disposed in close proximity to the surface of the article assuring uniform agitation over the surfaces to be plated. The agitation of the electrolyte in the vicinity adjacent to the anode surfaces occasioned by the controlled withdrawal of electrolyte through the manifold assembly dispenses with the need of employing supplemental agitation devices such as air agitation, for example.

The elimination of air agitation in accordance with the present invention overcomes the problems associated in prior art plating cells employing air agitation as a result of variations in air flow resulting in non-uniform agitation in the vicinity of the cathode and anodes which in some instances results in a destruction of the anode film and the formation of a non-uniform electrodeposit on the cathode being plated. In addition, the use of air agitation can cause irregularities and/or non-uniform local current distribution as well as increased voltage requirements due to the increased ohmic resistance of air voids in the electrolyte. The elimination of air agitation overcomes the foregoing problems and provides the further benefit in a reduction in the oxidation rate of the organic additive components in the electrolyte thereby achieving better process control and a reduction in the consumption of such organic additives. Additionally, the elimination of air and its tendency to oxidize such additives further reduces the concentration of contaminating by-products in the electrolyte. The elimination of the need for air agitation further reduces the formation of mist above the plating cell providing an improved working environment and reducing ventilation and scrubbing of mist in the exhaust gases.

In addition to the foregoing advantages, the elimination of air agitation further provides for a substantial reduction in the tendency to cause foam formation on the surface of the electrolyte. Additionally, the elimination of air agitation further eliminates a source of contamination of the electrolyte by oils and lubricants entrained in the air employed for air agitation with a corresponding elimination or reduction in the need for air purification equipment.

In accordance with the process aspects of the present invention, the preservation of high-plating efficiency is maintained by the controlled withdrawal of electrolyte from a vicinity adjacent to the soluble anodes immersed in the electrolyte in a manner to provide a substantially uniform mass transport rate across the fluid film on the surfaces of the anode thereby preventing anode passivation and avoiding destruction of the anode film thereon. Optimum replenishment of the metal ions in the electrolyte is achieved by the progressive dissolution of the anodes providing for electrodeposition rates heretofore unobtainable in accordance with prior art apparatuses.

Additional benefits and advantages of the present invention will become apparent upon a reading of the description of the preferred embodiments taken in conjunction with the accompanying drawings.

BRIEF DESCRIPTION OF THE DRAWINGS

FIG. 3 is a longitudinal vertical sectional view of the apparatus shown in FIG. 2 and taken along the line 3—3 thereof.

DESCRIPTION OF THE PREFERRED EMBODIMENTS

Figure 2:
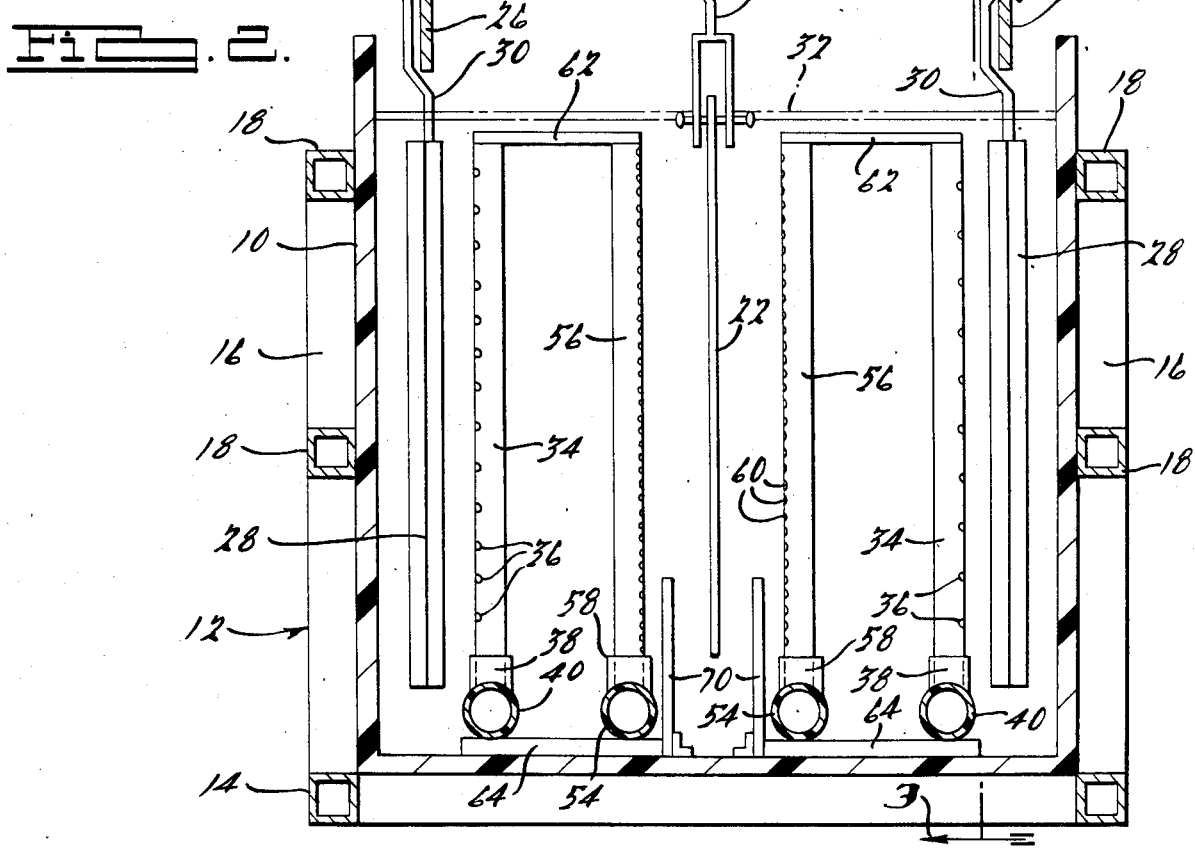
FIG. 2 is a transverse vertical sectional view of the apparatus shown in FIG. 1.

Referring now in detail to the drawings, an electrolytic apparatus constructed in accordance with the preferred embodiments of the present invention comprises a tank or receptacle 10 adapted to contain an electrolyte of the desired composition such as a copper electrolyte. The tank 10 is constructed of a suitable corrosion resistant material such as polyvinyl chloride or may comprise a corrosion resistant metal such as stainless steel having a protective plastic coating, such as plastisol coating thereover. As best shown in FIGS. 2 and 3, the tank 10 is supported on a suitable box framework indicated at 12 including base beams 14, upright beams 16 and longitudinally extending side beams 18.

A cathode bar 20 is suitably supported and extends longitudinally above the center line of the tank 10 from which a workpiece 22, such as a printed circuit board, is suspended by means of a pair of supporting hooks 24. In accordance with conventional practice, the cathode bar 20 is connected to an electric DC source for effecting a cathodic electrification thereof which is transferred through the conductive supporting hooks 24 to the workpiece 22 disposed in electrical connection therewith.

Figure 1:
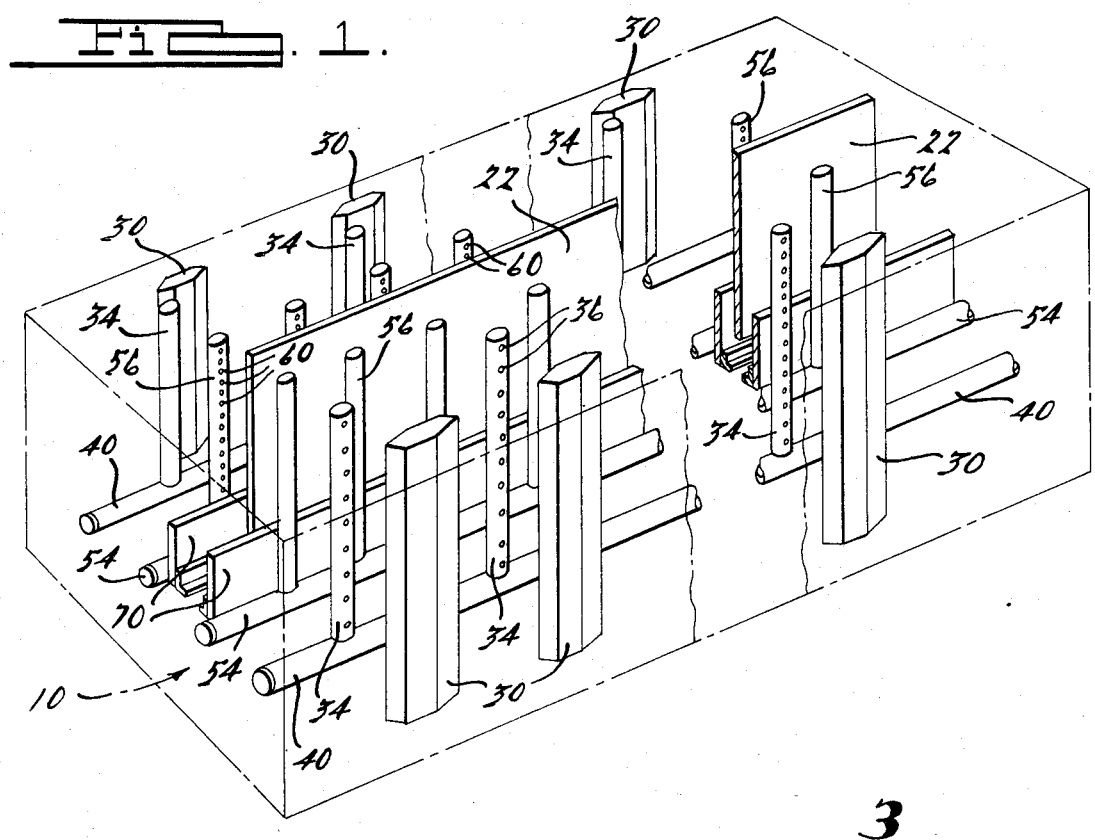
FIG. 1 is a fragmentary perspective view, partly in section and partly in phantom, of an electrolytic apparatus constructed in accordance with the preferred embodiments of the present invention.

As may be best seen in FIGS. 1 and 2, a pair of anode bars 26 are supported along each side of the tank 10 in spaced relationship from each side of the workpiece 22 and from which a plurality of soluble anodes 28, such as copper anodes, are suspended from hooks 30 in electrical contact with the anode bar. The anode bars 26 are similarly electrically connected to a DC power source for effecting anodic electrification of the anode bars and the anodes suspended therefrom. The electrolyte solution level is controlled at an appropriate height in the tank so as to maintain the anodes immersed therein such as at a level indicated at 32 in FIG. 2.

As shown in the drawings, a perforated manifold 34 is disposed in a substantially upright position adjacent to and inwardly of each anode 28 and is formed with a plurality of inlet ports 36 disposed at spaced intervals along the length thereof. The location, number and geometry of the suction manifolds 34 and the number of the inlet ports 36 therealong provides for more uniform electrolyte flow conditions in the tank or plating cell in comparison to the use of a localized return pipe or pipes in accordance with prior art practices. The more uniform electrolyte flow in the tank or plating cell simultaneously provides for more uniform flow and replenishment of electrolyte in the vicinity of the cathode being plated. The lower end of each of the perforated manifolds 34 are connected by means of a coupling 38 to a suction header conduit 40 which extends longitudinally along the bottom of the tank in upwardly spaced relationship therefrom. The right hand end of the suction header 40 as schematically illustrated in FIG. 3 of the drawing is connected by means of an upright conduit 42 which passes through the side wall of the tank 10 and in turn is connected to a conduit 44 provided with a valve 46 which is connected to the suction or inlet side of a pump 48. The flow control valve 46 is adapted to be adjusted so as to control the volume of electrolyte withdrawn through the inlet ports of the manifolds 34 to achieve an appropriate rate of flow of electrolyte across the surfaces of the anodes 30 to achieve a substantially uniform mass transport rate while at the same time, avoiding the destruction of the anode film. A substantially uniform mass transport rate without destruction of the anode film can be achieved by controlling the velocity of the electrolyte across the anode surface within a range of about 0.3 to about 6 feet per second, and preferably, from about 1 to about 3 feet per second. The particular velocity at which optimum efficiency is attained will vary depending on the particular anode geometry and spacing.

In accordance with a preferred embodiment of the electrolytic apparatus, the electrolyte withdrawn through the perforated manifolds and suction header 40 is recirculated through a conduit 50 connected to the pressure side of the pump 48 which is connected to an upright conduit 52 that extends downwardly along the inner side wall of the tank 10 as shown in FIG. 3. The conduit 52 is connected to a pressure header 54 extending longitudinally along and spaced from the base of the tank at a position inwardly to the suction headers 40 and adjacent to workpiece 22 immersed therein. As best seen FIGS. 1 and 2, a plurality of perforated discharge manifolds 56 are connected by means of couplings 58 at their lower ends to the pressure header 54 and extend upwardly in spaced substantially parallel relationship adjacent to the side surfaces of the workpiece 22. The discharge manifolds 56 are provided with a plurality of discharge ports or nozzles 60 oriented in the direction of the side surfaces of the workpiece 22 to discharge electrolyte against the surfaces effecting a continued supply of replenished electrolyte.

The suction manifolds 34 and discharge manifolds 56 are retained in appropriate position by means of a header plate 62 affixed to and extending across the upper ends thereof. A spacer plate 64 is disposed below the suction header 40 and pressure header 54 and secured thereto for maintaining the headers in appropriate spaced parallel relationship and spaced upwardly from the surface of the bottom of the tank. The size and number of discharge nozzles in the discharge manifolds 56 is selected and controlled so as to provide for substantially uniform coverage of each side surface of the workpiece 22 with fresh electrolyte during an electroplating operation.

It is also contemplated, that in lieu of the discharge manifolds 56, all or a portion of the electrolyte withdrawn through the suction manifolds 34 can be directly discharged into the plating tank, preferably in a manner to provide for solution agitation at a position adjacent to the workpiece 22.

In accordance with the specific arrangement shown employing the discharge manifolds 56, optimum electroplating of the workpiece is achieved by adjusting the flow control valve 46 to provide for controlled electrolyte withdrawal from a vicinity adjacent to the anodes. Similarly, in such instances in which the quantity of electrolyte withdrawn through the suction manifolds 34 is insufficient to provide for optimum electrolyte discharge from the discharge manifolds 56, a second flow control valve 66 is provided as best seen in FIG. 3 which can be opened to withdraw supplemental electrolyte through a conduit 68 disposed adjacent to the base of the tank to provide the appropriate total electrolyte volume discharged through the discharge manifolds. In order to provide better control of the total volume of electrolyte discharged from the discharge manifolds, a flow control valve 82 is incorporated in the discharge conduit 50 which can be adjusted for total return volume while retaining valves 46 and 66 in a preset adjusted position.

In accordance with a further preferred embodiment of the present invention and as best shown in FIGS. 1 and 2, a pair of current shields 70 are secured in an upright position and extend longitudinally along the center line of the tank at a position spaced from the lower portion of the workpiece 22. The use of current shields provides for a better distribution of the electrical current flowing between the anode and workpiece thereby achieving a more uniform thickness of electrodeposit over the entire area or selected sections of the workpiece 22.

In operation, a workpiece 22 to be electroplated is automatically or manually transferred to a position in suspended relationship from the cathode bar 20 at a position such as shown in FIG. 2. The pump 48 (FIG. 3) is energized and the flow control valves 46, 66, and 82 are adjusted to provide for optimum electrolyte withdrawal and discharge during the electroplating operation. In accordance with conventional practice, the recirculated electrolyte can be subjected to filtration to remove extraneous particulate matter therefrom and can also be replenished with additional chemical agents to maintain the composition thereof within appropriate limits.

In order to further illustrate the benefits of the present invention, tests were conducted in a laboratory prototype plating cell having the general arrangement as shown in FIG. 1 of the drawings and having a capacity of 100 gallons (about 380 liters) electrolyte. The tank was filled with an acidic copper electrolyte of the type typically employed for plating printed wiring boards nominally containing about 27 grams per liter (g/l) copper ions, 0.07 g/l chloride ions, 262 g/l sulfuric acid and minor amounts of conventional proprietory organic brightening additives.

A printed wiring board was immersed in the electrolyte and phosphorized bar copper anodes of a standard type were immersed and anodically charged. The electrolyte was controlled at a nominal temperature of about 40° C.

A series of tests were conducted in which the flow rate expressed in terms of gallons per minute of electrolyte was withdrawn from the tank through the suction manifolds. The quantity was varied in incremental steps and the anode current density was progressively increased to determine the maximum satisfactory operating anode current density for each flow rate as well as the current density at which anode passivation occurred. The results are tabulated in Table 1.

TABLE 1

| Suction Manifold Flow Rate, gpm | Anode Current Density, ASF | |
|---|---|---|
| | Max. Satisfactory Current Density | Current Density at Which Anode Passivation Occurred |
| 0 | 110 | 115 |
| 1 | 115 | 120 |
| 2 | 120 | 125 |
| 4 | 130 | 135 |
| 8 | 180 | 200 |
| 16 | 200 | 225 |

As will be noted in Table 1, a substantial increase in the anode current density was possible for providing satisfactory plating operation as the flow rate of withdrawn electrolyte through the suction manifolds increased. The magnitude of anode current density is indicative of plating rate indicating that a substantial increase in the rate of copper deposition can be obtained in accordance with the present invention.

The foregoing tests were repeated employing an electrolyte temperature controlled at about 50° C. and similar results were obtained indicating a negligible effect of electrolyte temperature on the results.

While it will be apparent that the preferred embodiments of the invention disclosed are well calculated to fulfill the objects above stated, it will be appreciated that the invention is susceptible to modification, variation and change without departing from the proper scope or fair meaning of the subjoined claims.

I claim:

1. A process for effecting a rapid deposition of a metallic deposit on a substrate which comprises the steps of immersing a substrate in a body of electrolyte, cathodically electrifying the substrate, immersing at least one soluble anode in the electrolyte, anodically electrifying the anode to cause current to flow through the electrolyte between the substrate and the anode, and continuously withdrawing electrolyte in the vicinity of such soluble anode to provide a controlled rate of flow of electrolyte across the anode surface to achieve a substantially uniform mass transport rate across the fluid film on the surface of the anode, such flow being in a direction away from the anode surface and toward the substrate, with the flow velocity across the anode surface being within the range of 0.3 to about 6 feet per second.

2. The process as described in claim 1 in which the step of withdrawing electrolyte is performed to provide a velocity of flow of electrolyte across the anode surface within a range of about 1 to about 3 feet per second.

3. The process as described in claim 1 including the further step of discharging at least a portion of the withdrawn electrolyte to the body of the electrolyte.

4. The process as described in claim 3 in which the step of discharging at least a portion of the withdrawn electrolyte to the body of electrolyte is performed in the vicinity of the substrate to impart agitation to the electrolyte adjacent to the substrate.

* * * * *